United States Patent
Calvert

(10) Patent No.: US 6,472,748 B1
(45) Date of Patent: Oct. 29, 2002

(54) SYSTEM AND METHOD FOR PROVIDING MMIC SEAL

(75) Inventor: Carl Edward Calvert, Bellevue, WA (US)

(73) Assignee: Harris Broadband Wireless Access, Inc., Bellevue, WA (US)

( * ) Notice: Subject to any disclaimer, the term of this patent is extended or adjusted under 35 U.S.C. 154(b) by 0 days.

(21) Appl. No.: 09/519,140

(22) Filed: Mar. 6, 2000

(51) Int. Cl.[7] .......................... G02B 6/10; H01L 29/34; G11C 8/00

(52) U.S. Cl. .................. 257/728; 257/724; 257/725; 257/787; 257/788; 257/789; 257/528; 257/533; 257/531; 257/48; 257/659; 257/660; 327/513; 327/516; 327/520; 327/264; 327/268; 327/344; 365/174; 365/149; 250/338.4; 219/660; 219/668; 219/702

(58) Field of Search .......................... 257/678, 725, 257/724, 728, 48, 531, 528, 533, 787, 788, 660, 659, 789, 691, 773; 365/230.06, 51, 174, 43, 149; 250/338.4; 385/2, 9, 8; 359/245; 219/660, 702, 668; 430/315, 258, 311, 319, 320, 329; 327/525, 478, 517, 378, 309, 264, 268, 344

(56) References Cited

U.S. PATENT DOCUMENTS

| | | | | |
|---|---|---|---|---|
| 4,724,495 A | * | 2/1988 | Hedberg et al. | 360/22 |
| 5,545,511 A | * | 8/1996 | Hulderman et al. | 430/315 |
| 5,805,009 A | * | 9/1998 | Casper et al. | 327/525 |
| 5,856,705 A | * | 1/1999 | Ting | 257/640 |
| 6,198,100 B1 | * | 3/2001 | Edeen et al. | 250/338.4 |
| 6,282,145 B1 | * | 8/2001 | Tran et al. | 365/51 |
| 6,292,598 B1 | * | 9/2001 | Price et al. | 359/245 |

* cited by examiner

Primary Examiner—Alexander O. Williams
(74) Attorney, Agent, or Firm—Duane Morris LLP

(57) ABSTRACT

A system and method for maintaining desired circuit component attributes is shown. According to a preferred embodiment, a high frequency circuit component, such as a MMIC, is retained in a circuit using a degradeable material, such as silver filled epoxy, wherein a portion of the degradeable material remains exposed. A protective coating of resin is applied to the exposed portion of the degradeable material by preferably depositing a predetermined amount of protective material, such as an epoxy resin, a void near the exposed portion of the degradeable material. The protective material preferably migrates to fully cover the exposed portion of the degradeable material without covering the circuit component. Accordingly, the circuit component is protected from substantial changes in operation characteristics due to the protective material and likewise is protected from changes in operation characteristics due to degradation of the degradeable material resulting from exposure.

53 Claims, 2 Drawing Sheets

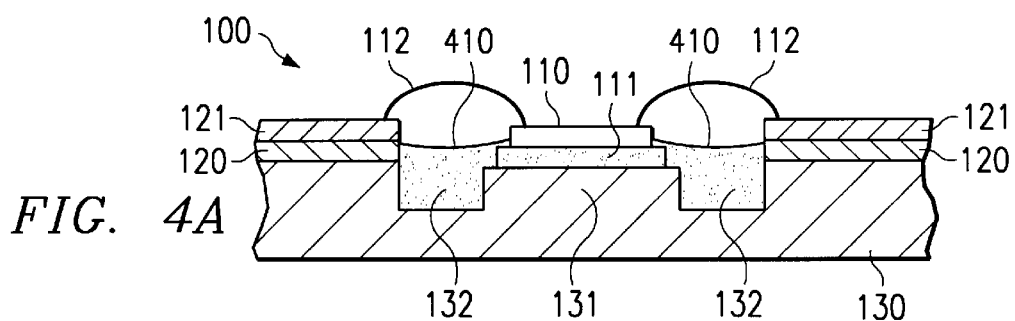
*FIG. 4A*
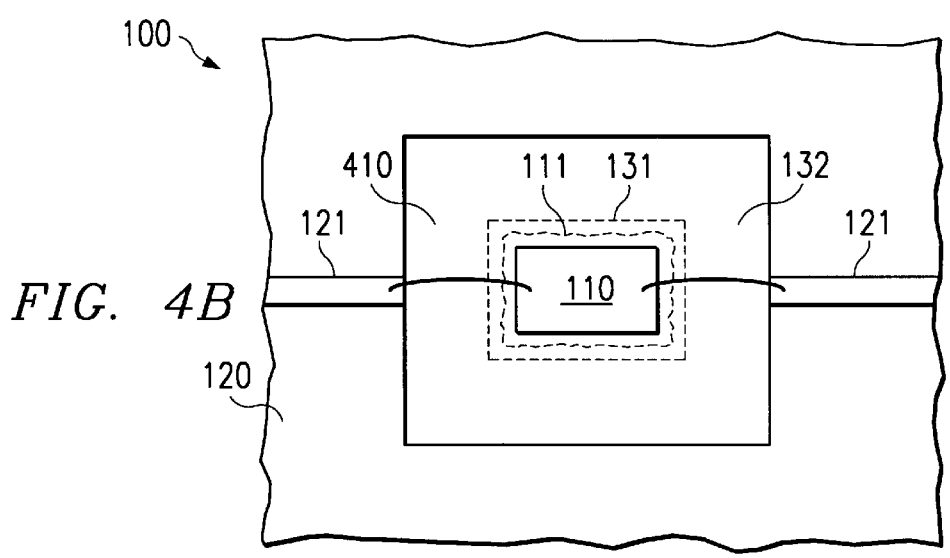
*FIG. 4B*
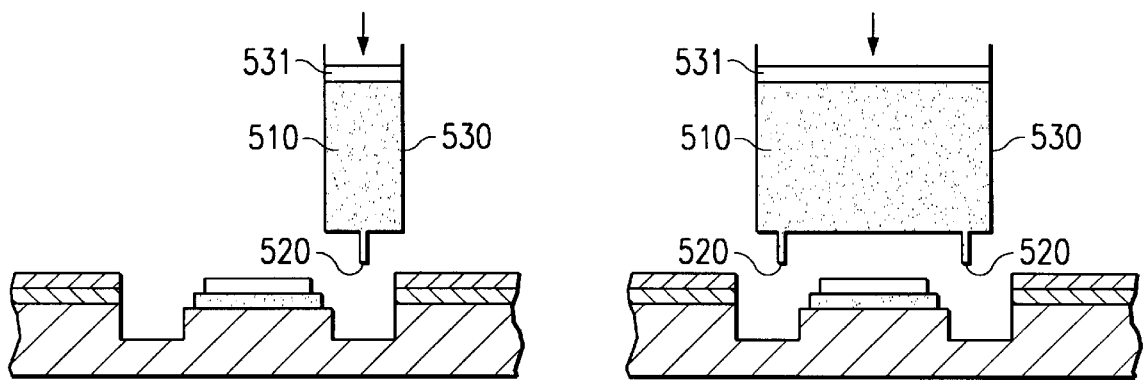
*FIG. 5A*     *FIG. 5B*

SYSTEM AND METHOD FOR PROVIDING MMIC SEAL

RELATED APPLICATION

The present application is related to co-pending and commonly assigned U.S. patent application Ser. No. 09/267,055 filed Mar. 12, 1999, entitled "MILLIMETER-WAVE FRONT END," the disclosure of which is hereby incorporated herein by reference.

TECHNICAL FIELD

The present invention relates generally to high frequency communication circuits and, more specifically, to maintaining desired circuit component attributes, such as monolithic microwave integrated circuit impedance, through sealing techniques.

BACKGROUND

With the advancement of new technologies and the opening up of additional radio frequency spectrum for commercial use, the use of wireless communications has flourished in recent years. Accordingly, communication systems providing large amounts of voice and/or data communication have begun to rely more and more heavily upon wireless links. For example, metropolitan communication networks often rely upon wireless links to provide connections where infrastructure, such as fiber optic links, is unavailable or not economical to deploy. Accordingly, point-to-point and point-to-multipoint microwave radio communication links are becoming very common to provide reliable high bandwidth communications.

The demand for such radio communication links has driven the need for reliable and low cost wireless systems and components. Moreover, as the demand for such links has grown the need to be able to economically construct and deploy suitable systems and components has magnified. For example, the use of miniaturization, such as very large scale integrated (VLSI) circuits, surface mount technology, and application specific integrated circuits (ASIC), in constructing communication systems is common both to provide low-cost parts and provide assembly economies as well as to provide a smaller and more energy efficient component which is easier to deploy and operate.

In providing microwave communications equipment, the use of microwave integrated circuits (MIC), particularly monolithic microwave integrated circuits (MMIC), is becoming prevalent. However, the use of such circuits presents difficulties associated therewith. A typical problem facing equipment designers and manufactures is determining the effect of actually deploying a MMIC in a circuit on the performance of the MMIC. Specifically, the presence of leads, bond wires, and grounding pins all affect the MMIC behavior.

Moreover, one installation of a MMIC involves the holding in place of a MMIC component in a circuit using a bonding substance such as an epoxy. However, a silver filled epoxy used for such purposes is prone to oxidation at any exposed points ($Ag \Longrightarrow Ag_2O_3$) Oxidation of the epoxy has been found to cause the performance of the MMIC to appreciably change over time, e.g., as the epoxy oxidizes the impedance of the MMIC device changes.

Accordingly, one solution is to incarcerate the MMIC device in a protective container when deployed in a circuit in order to protect the device from degraded performance, such as due to the aforementioned oxidation of the bonding agent. For example, a container constructed using a top, such as a ceramic lid having a cavity disposed therein to envelope the MMIC, and the circuit board or ground plane as a base may be used. However, the use of such a container adds size as well as expense to the MMIC circuit and, therefore, may not be an acceptable solution in many commercial situations.

A relatively simple and inexpensive alternative to the above described container is to seal the MMIC in a resin, such as a polymeric resin, e.g., epoxy resin, pejoratively referred to as "GLOB" or "GLOB TOP" because of its seemingly arbitrary dollop application. This solution has the advantage of utilizing commonly available items, such as epoxy resin, being relatively easy to apply, and providing a seal suitable for preventing undesired oxidation of the bonding agent.

The heretofore practice of applying protective resins has been to both cover the bonding agent, such as the aforementioned silver filled epoxy, and the MMIC, often also including leads, bond wires, et cetera, i.e., applying a "dollop" of epoxy. However, the presence of the protective resin itself has been found to affect the performance characteristics of the MMIC. Specifically, the application of an epoxy resin completely incarcerating a MMIC, although providing protection of the MMIC device and connections thereto, affects the impedance of the device and, thus, can cause appreciable mismatches between the device and additional circuitry coupled thereto.

The performance characteristic changes due to the application of the protective resin are often acceptable at lower frequencies, such as 12–18 GHz. However, at the higher frequencies of millimeter wave technology, such as 20–100 GHz, the changes due to the application of the protective resin often become intolerable.

Accordingly, a need exists in the art for a system and method for deploying MMIC devices in circuitry wherein performance characteristics are predictable and maintainable over a reasonable operating life of the device.

A further need exists in the art for systems and methods for providing and maintaining desired performance characteristics of MMIC devices inexpensively. Accordingly, a need exists for techniques adapted for simple, preferably automated, deploying of MMIC devices. Likewise, a need exists for deployed MMIC devices to maintain a relatively small package size.

SUMMARY OF THE INVENTION

These and other objects, features and technical advantages are achieved by a system and method which utilizes a precisely controlled application of a protective substance where a MMIC, or other device susceptible to alteration of performance characteristics due to deploying and/or aging, is deployed in a circuit. According to a preferred embodiment of the present invention, an amount of protective substance is deposited in such a way as to completely seal areas subject to causing performance characteristic change/degradation while minimizing contact with the MMIC or other deployed device. For example, a most preferred embodiment of the present invention utilizes a MMIC device disposed on a circuit support structure surface, such as pedestal of an underlying ground plane, using a silver filled epoxy, wherein a controlled amount of protective epoxy is deposited so as to completely protect any exposed surfaces of the silver filled epoxy while only minimally contacting the MMIC device.

A technical advantage is achieved in that the performance characteristics of the MMIC device remain substantially unchanged by the application of the protective element of the present invention. Moreover, the performance characteristics of the MMIC device may be maintained throughout an extended operational life because elements, such as the above described silver based epoxy bonding agent, are protected from degradation which may result in a change in the performance characteristics of the MMIC device.

A still further advantage is achieved by the present invention as both the cost of the protective material and its application according to the present invention are relatively inexpensive and well suited for automated application.

A yet further advantage is realized according to the present invention because, although providing the desired protective characteristics, the size and bulk of the MMIC device in the finished circuit remains substantially unchanged, therefore avoiding increases in size of the final equipment incorporating the MMIC device.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which:

FIG. 4A shows a cross section view of an embodiment of a protective coating according to the present invention;

FIG. 4B shows a plan view of the embodiment of FIG. 4A;

FIG. 5A shows one embodiment of apparatus adapted to deposit the protective coating of FIG. 4A; and FIG. 5B shows an alternative embodiment of apparatus adapted to deposit the protective coating of FIG. 4A.

DETAILED DESCRIPTION

In providing wireless communications equipment, such as radios, modems, frequency converters, duplexers, diplexers, filters, switches and switch matrixes, etcetera, the use of integrated circuits and other solid state devices has become ubiquitous. Accordingly, in providing microwave communications equipment solid state devices specifically developed for use at microwave frequencies, such as microwave integrated circuits (MIC) and monolithic microwave integrated circuits (MMIC), are commonly utilized. However, the use of such circuits present difficulties associated with the high frequencies with which they operate.

Equipment designers and manufactures are faced with the problem of determining the effect of actually deploying a MMIC in a circuit on the performance of the MMIC as even slight changes of impedance, such as due to stray capacitances and inductances resulting from coupling with other circuit elements, can cause significant changes in performance of the MMIC device and/or circuit at such high frequencies. For example, the impedance of the MMIC device as installed in the circuit is affected by the relative placement of other circuit elements, such as microstrip lines, ground planes, etcetera, and the dielectric constant of any media disposed between such other circuit elements and the MMIC device. Accordingly, any addition or change of a media between the MMIC device and other circuit elements can result in an appreciable change in circuit operation.

Figure 1A:
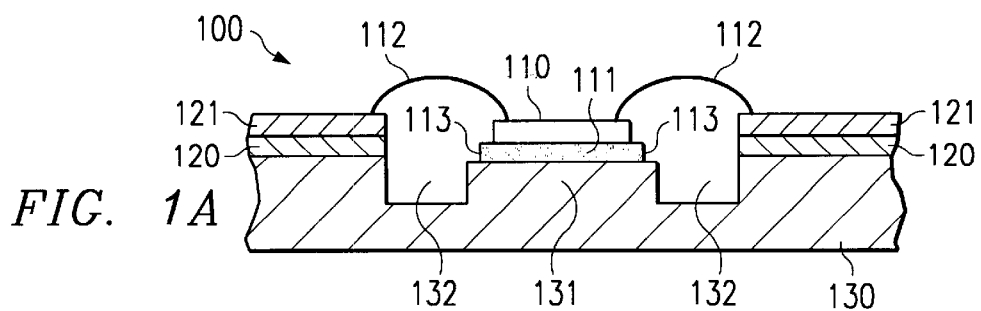
FIG. 1A shows a cross section view of a deployment of a MMIC device in a circuit.
Figure 1B:
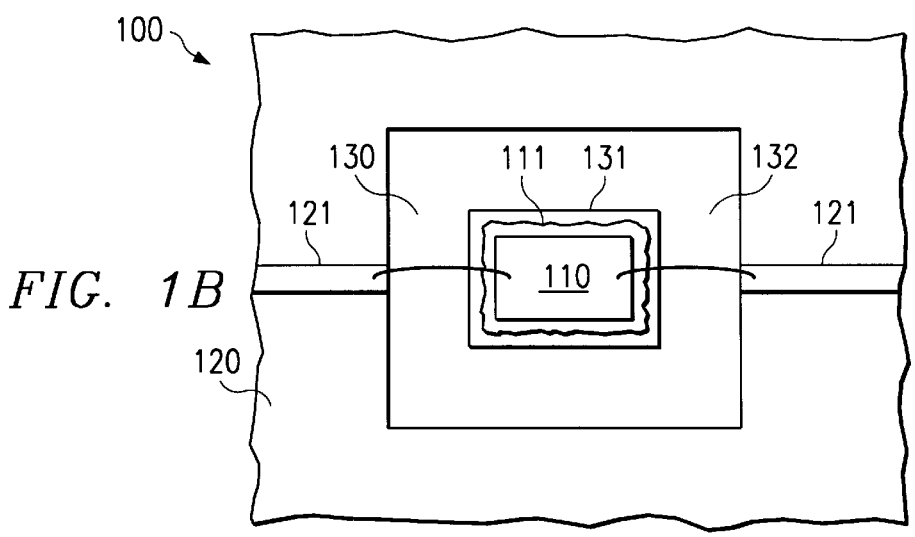
FIG. 1B shows a plan view of the MMIC deployment of FIG. 1B.

As shown in the cross section view of FIG. 1A, a preferred deployment of a MMIC, such as MMIC 110, involves its retention in a circuit, such as circuit 100, utilizing a bonding agent, such as bonding agent 111 which may be comprised of a silver filled epoxy. Circuit 100 is shown in FIG. 1B in a plan view corresponding to the cross section view of FIG. 1A. In the exemplary embodiment of FIGS. 1A and 1B, circuit 100 includes circuit board 120, which is preferably a dielectric substrate as is commonly used in printed circuit applications, having circuit leads and components disposed thereon, such as microstrip transmission line portions 121. MMIC 110 is preferably coupled to other portions of circuit 100, such as microstrip transmission line portions 121, through leads, such as bond wires 112.

Ground plane 130, such as may be provided by an aluminum sheet or panel, is disposed beneath circuit board portions 120 and MMIC 110 and/or to provide a support structure to circuit 100 and/or to provide a grounding circuit useful in achieving desired circuit characteristics, such as the above microstrip transmission lines. Additionally, ground plane 130 provides channel 132 disposed around pedestal 131 upon which MMIC 110 is disposed. Channel 132 provides a desired amount of isolation between MMIC 110 and the remaining components of circuit 100, to thereby avoid the effects of coupling there between, such as might result in an effective impedance of MMIC 110 and/or surrounding circuit elements different than that desired and/or predicted.

Of course it should be appreciated that circuit 100 is but one example of a circuit in which a MMIC or other high frequency device may be deployed. For example, circuits utilizing MMIC devices and/or discrete devices suitable for adaption according to the present invention are shown in the above referenced patent application entitled "MILLIMETERWAVE FRONT END." Accordingly, the particular embodiment of circuit 100 is provided herein only to aid in understanding the present invention and is not intended to present limitations thereto.

It should be appreciated that various elements of circuit 100 may be prone to degradation over time. Such degradation often adversely affects operation of the circuit elements and/or the overall circuit, depending on factors such as the severity of the degradation, the tolerances of the circuit design, and even the frequencies accommodated by the circuit elements and/or the overall circuit. Generally, circuits adapted to handle high frequencies, such a microwave frequencies, are susceptible to adverse effects even with relatively small changes in circuit element performance. These adverse effects are even more pronounced at the higher frequencies, such as millimeter wave frequencies.

The silver filled epoxy commonly used as a bonding agent, such as bonding agent 111, is prone to oxidation at any exposed points. For example, edges 113 of bonding agent 111 are exposed to the ambient environment and, therefore, may be prone to oxidation. Oxidation of the epoxy has been found to cause the performance of the MMIC to appreciably change over time. Specifically, it has been found that as silver filled epoxy oxidizes, the impedance of the MMIC device changes, thus adversely affecting operation of the circuit. For example, microstrip transmission line portions 121 and MMIC 110 may have all been initially deployed to present a same impedance to provide proper matching and, therefore, efficient circuit operation. However, if the impedance of MMIC 110 were to change over time, due to the oxidation of bonding agent 111, there may be an appreciable mismatch in impedance between microstrip transmission line portions 121 and MMIC 110 causing adverse effects, such as reflected energy, mistuning of the circuit, etcetera.

Figure 2:
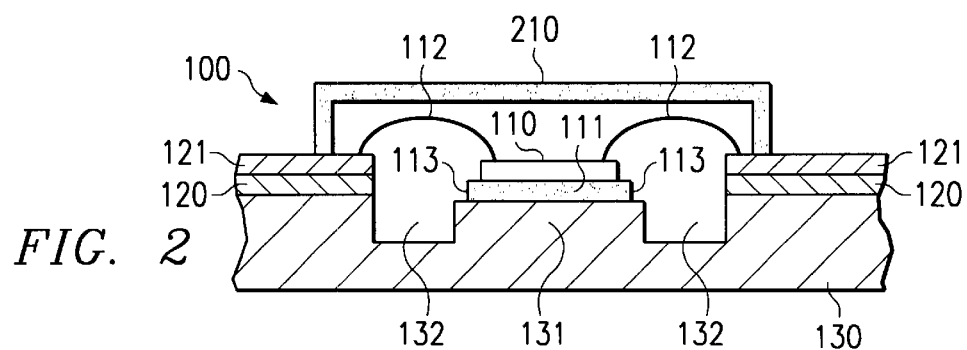
FIG. 2 shows a cross section view of one solution to provide protection to the MMIC device of FIG. 1A.

Directing attention to FIG. 2, one solution for providing protection to the MMIC deployment, is to incarcerate the MMIC device in a protective container. As shown in the example of FIG. 2, MMIC 110 and bonding agent 111 are incarcerated by the addition of cover 210 to circuit 100. Cover 210, which may be formed of a ceramic, metal, or other suitable material having a shape suitable for accommodating MMIC 110 and bonding agent 111, is integrated with portions of circuit 100 surrounding MMIC 110 such that a protective seal isolating the exposed portions of bonding agent 111 from the ambient atmosphere is 20 provided. Cover 210 may be laser sealed and the area within filled with an inert gas, for example.

Although providing adequate protection of edges 113 of bonding agent 111, cover 210 adds significant costs to the production of circuit 100 in the placement and scaling of the cover in addition to the cost of the cover itself. Moreover, it should be appreciated that the size and bulk of the full MMIC component in the finished circuit has been increased significantly. Additionally, the disposal of such a cover in near proximity to the MMIC device generally results in an operational change, such as a change in impedance, due to the effects of the cover material and its relative placement. Although these effects may be predictable through the controlled manufacture of the cover and its consistent placement in the circuit, these considerations tend to further increase costs associated therewith. Moreover, the effects resulting from the placement of the cover near the MMIC device tend to limit the ability to reduce the size of the cover beyond a particular point.

Figure 3:
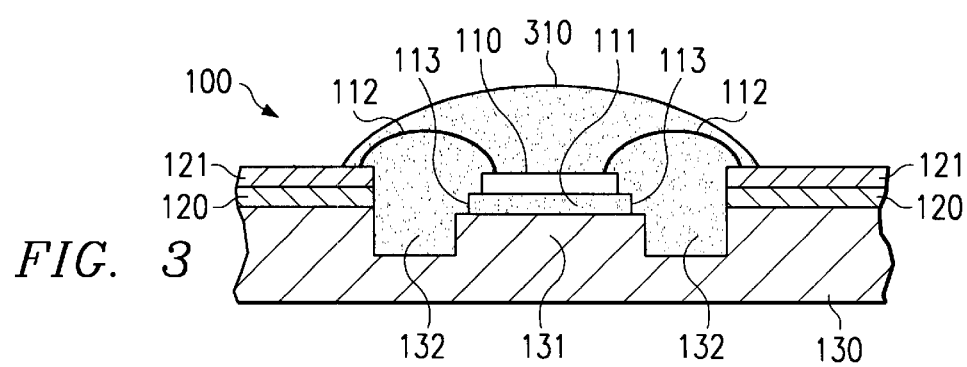
FIG. 3 shows a cross section view of an alternative solution to provide protection to the MMIC device of FIG. 1A.

A relatively simple and inexpensive alternative to the above described container is to seal the MMIC in a resin or epoxy. Directing attention to FIG. 3, an example of a MMIC device sealed in epoxy is shown. As shown in the example of FIG. 3, MMIC 110 and bonding agent 111 are incarcerated by the addition of epoxy dollop 310. Epoxy dollop 310 may be a polymeric epoxy resin or other suitable material for applying to circuit 100 in a fluid state which cures to a state to provide adequate protection to edges 113 of bonding agent 111. This solution has the advantage of utilizing commonly available materials, being relatively easy to apply, and providing a seal suitable for preventing undesired oxidation of the bonding agent.

However, as dollop 310 completely covers, and is in contact with, MMIC 110 when applied to protect edges 113, dollop 310 affects the operational characteristics of MMIC 110. Although the affects to the operational characteristics of MMIC 110 are generally small, it has been found that such changes cause undesired and intolerable results at high frequencies such as 20 GHz and above. Accordingly, where circuit 100 is utilized in a millimeter wave technology apparatus, such as a system adapted to provide communications at 38 GHz, dollop 310 may be an acceptable solution in a portion of circuit 100 wherein intermediate frequencies are used, but not in portions of the circuit operate at the higher frequencies.

Directing attention to FIGS. 4A and 4B, a preferred embodiment of the present invention is shown in the exemplary circuit 100. As shown in FIG. 4A, the preferred embodiment of the present invention utilizes a precisely controlled application of a protective substance to minimize its contact with the MMIC and to minimize changes to the circuit element interactions. Accordingly, channel 132 is partially filled with strip or fillet 410 comprising protective material, such as epoxy resin, according to the present invention. It should be appreciated that fillet 410, although completely covering edges 113 of binding agent 111, is only in minimum contact with MMIC 110. Moreover, the amount of protective agent forming fillet 410 has been carefully controlled so as to minimize the amount used according to the present invention. In addition to the obvious savings in the cost of the material, such a controlled use of the protective agent minimizes the change in the dielectric constant as experienced by MMIC 110, as well as other circuit elements disposed nearby. For example, bond wires 112 and microstrip transmission line portions 121 remain substantially unaffected by fillet 410. Moreover, as MMIC 110 is not completely incarcerated with the protective agent of the present invention, other advantages are realized, such as improved heat dissipation.

Preferred embodiments of the present invention utilize polymeric resins in providing a protective agent. A most preferred embodiment of the present invention utilizes ABLEBOND polyimide adhesives available from Ablestik Electronic Materials and Adhesives, Rancho Dominguez, Calif. Alternative embodiments of the present invention may utilize polyurethane or silicone based resins and/or may be filled with various compounds, such as a ceramic filled epoxy.

According to a preferred embodiment of the present invention, an amount of protective agent is deposited in such a way as to completely seal areas subject to causing performance characteristic change/degradation while minimizing contact with the MMIC or other deployed device. For example, in a most preferred embodiment of the present invention, utilized with circuit 100 of FIG. 4B, an amount of protective agent determined to fill channel 132 just to the point of covering bonding agent 111 is deposited in channel 132 during construction of circuit 100.

Accordingly, a determination may be made as to the exact volume of material needed to fill the area of channel 132 without overflowing to the top of the device. This determination may be accomplished through process experimentation and/or modeling in pre-production and can be implemented by programming of computer controlled dispensing equipment.

It is desired to minimize contact between protective agent 111 and MMIC device 110 according to the preferred embodiment of the present invention. Accordingly, protective agent 410 is preferably deposited in a controlled manner into channel 132, such as through the use of a small extrusion orifice placed in juxtaposition with a channel 132 in order to allow the extrusion of the aforementioned amount of protective agent into channel 132.

Directing attention to FIG. 5A, a preferred embodiment protective agent extrusion system disposed in juxtaposition with channel 132 to deposit a protective agent according to the present invention is shown. Specifically, manifold 530 contains protective agent 510 prior to depositing into channel 132. Plunger 531 is operated to change the volume of manifold 530 by an amount corresponding to the amount of protective agent determined to provide the desired protective qualities according to the present invention. As the volume of manifold 530 is changed, protective agent 510 escapes manifold 530 through extrusion orifice 520 and is deposited in channel 132.

It should be appreciated that the extrusion orifice of FIG. 5A may be utilized with a broad range of circuits, i.e., the extrusion orifice will accommodate a wide variety of shapes and sizes of areas into which a protective agent is to be deposited. Moreover, the extrusion orifice of FIG. 5A may easily be positioned so as not to cause extrusion of protective material onto MMIC 110 as well as other circuit components, such as bond wires coupling MMIC 110 to other circuit portions. Additionally or alternatively, extrusion orifice 520 may be moved to correspond with several locations of the area into which the protective agent is to be deposited. For example, extrusion orifice 520 may be moved, or the circuit disposed in juxtaposition therewith moved, while protective agent 510 is extruded to result in protective agent 510 being distributed during extrusion throughout channel 132. Alternatively, extrusion orifice 520 may be moved to a first position and an amount of protective material extruded and then moved to a second position and an amount of protective material extruded.

Preferably, protective agent 410 is adapted to provide a viscosity after extrusion to allow its migration within channel 132 to suitably cover, and therefore protect, bonding agent 111. Accordingly, the protective agent utilized according to a preferred embodiment of the present invention is an epoxy compound selected/adapted to exhibit desired flow characteristics when uncured and sufficiently rapid curing times to allow movement/manipulation of the host circuit consistent with commercial production practices after its application.

According to a preferred embodiment, the protective agent used has a low "surface tension" and low viscosity, i.e., 150 cP. If the epoxy compound does not initially present a desirable surface tension, it can be adjusted, such as by elevating the temperature of the encapsulant or the work piece, i.e., 60° C. by heated syringe or hot plate. Additionally or alternatively, the viscosity of the protein agent may be adjusted, if desired, such as through the addition of a compatible solvent or other suitable additive. However, in some embodiments, such as where channel 132 is relatively large or includes numerous and/or tight corners to be traversed, adaptation of the protective agent surface tension and/or viscosity may not result in complete coverage of the surfaces to be protected due to a large area to be spanned in the migration or due to the resistance associated with changes in the direction of migration of the protective agent.

Accordingly, a preferred embodiment of the present invention utilizes multiple extrusion orifices to reduce the area of migration required and/or to reduce the relative movement of extrusion orifice 520 relied upon. Directing attention to FIG. 5B, an embodiment of a protective agent extrusion system providing multiple extrusion orifices disposed in juxtaposition with channel 132 is shown. It should be appreciated that with the two extrusion orifice embodiment of FIG. 5B, protective agent 510 may be required to migrate a distance up to one half that of the embodiment of FIG. 5A in order to completely protect bonding agent 111. Of course, additional alternative embodiments may be utilized further decreasing this distance, such as through the use of an orifice corresponding to each side and/or corner of channel 132.

Alternatively, an extrusion orifice shaped to correspond to the shape of a cavity to be filled, i.e., a rectangular extrusion slit disposed in the bottom of manifold 530 corresponding to the size of channel 132 may be utilized. Such an extrusion orifice would require the least amount of protective agent migration and/or extrusion orifice relative movement and, therefore, may present a desirable alternative where a very viscous protective agent is utilized. However, a disadvantage of such an extrusion orifice is that it would be limited in use to particular instances where the area for protective agent deposit includes an area substantially corresponding to the extrusion orifice, although by relying on protective agent migration the area may include additional portions not corresponding to the extrusion orifice. Additionally, such an extrusion orifice may be undesirable for use in applications where other circuit components, such as bond wires connecting the MMIC to other portions of the circuit, are disposed between the extrusion orifice and the area into which the protective agent is to be deposited. Of course, modifications could be made to the extrusion orifice, such as to prohibit extrusion in areas corresponding to such circuit components.

It should be appreciated that although protection of a bonding agent has been described herein with respect to a preferred embodiment, there is no limitation to the use of the present invention with bonding agents. For example, where a circuit component itself is susceptible to damage/degradation due to exposure, the principals of the present invention may be utilized in providing protection thereto.

Additionally, it should be appreciated that although a preferred embodiment of the present invention has been described above with reference to the use of a MMIC device, the present invention is not limited in application to such devices. Accordingly, the present invention may be utilized in providing predictable and maintainable performance characteristics are over a reasonable operating life of many devices adversely affected by changes in items and materials being exposed or partially exposed, such as any device operating at high frequencies, such as a Ga As FET or a Ga As diode.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for maintaining desired operating characteristics of a circuit component, said system comprising:

a circuit component;
a degradeable media associated with said circuit component, wherein said degradeable media has at least one exposed portion associated therewith;
a void provided in a corresponding relationship with said exposed portion of said degradeable media; and
a protective agent deposited in said void in an amount predetermined to envelope said exposed portion of said degradeable media while minimizing contact with said circuit component.

2. The system of claim 1 wherein said circuit component is a high frequency circuit component.

3. The system of claim 2 wherein said high frequency circuit component operates with frequencies of at least 20 GHz.

4. The system of claim 1 wherein said circuit component is a microwave integrated circuit.

5. The system of claim 1 wherein said circuit component is a discrete circuit component.

6. The system of claim 1 wherein said degradeable media is a bonding agent utilized in securing said circuit component.

7. The system of claim 6 wherein said bonding agent is a silver filled epoxy.

8. The system of claim 1 wherein said degradeable media is a dielectric material utilized in electrically isolating said circuit component.

9. The system of claim 1 wherein said degradeable media is a thermally conductive material utilized in dissipating heat associated with said circuit component.

10. The system of claim 1, further comprising:
a support structure providing a circuit base for said circuit component, wherein said void comprises a relieved portion of said support structure.

11. The system of claim 10 wherein said relieved portion of said support structure comprises a channel having at least two sides.

12. The system of claim 10 wherein said support structure includes a pedestal to provide support for said circuit component, and wherein said relieved portion of said support structure at least in part defines said pedestal.

13. The system of claim 10 wherein said support structure comprises a ground plane structure.

14. The system of claim 13 wherein said ground plane structure includes a metal plate having relieved portions disposed therein.

15. The system of claim 1 wherein said protective agent is a polymeric resin.

16. The system of claim 1 wherein said protective agent is adapted to allow sufficient migration of said protective agent within said void after deposit therein to completely envelope said exposed portion of said degradeable media.

17. The system of claim 16 wherein adaptation of said protective agent includes a protective agent viscosity in an uncured condition to accommodate extrusion of said protective agent into said void.

18. The system of claim 17 wherein said void comprises a channel having at least two sides, and wherein said viscosity further accommodates automated manufacturing processing of an assembly including said circuit component and said protective agent deposited in said channel without escape of said protective agent from said channel.

19. The system of claim 17, further comprising:
an extruder disposed in juxtaposition with said void, wherein said extruder includes a manifold containing an uncured protective agent reservoir and a first extrusion orifice.

20. The system of claim 19 wherein said extruder includes a second extrusion orifice, wherein said first extrusion orifice and said second extrusion orifice are disposed on said extruder to deposit said protective agent in different portions of said void simultaneously.

21. The system of claim 19 wherein said first extrusion orifice is shaped to correspond at least in part to a shape of said void.

22. The system of claim 19 further comprising:
a movement mechanism providing relative motion between said extruder and an assembly including said circuit component and said void, wherein said relative motion is controlled to dispose said first extrusion orifice in juxtaposition with said void at a plurality of points of said void.

23. The system of claim 22 wherein extrusion of said protective agent is at least in part accomplished during said relative movement.

24. The system of claim 22 wherein extrusion of said protective agent is accomplished in iterations corresponding to disposal of said first extrusion orifice in juxtaposition with particular points of said plurality of points of said void.

25. The system of claim 1 wherein said desired operating characteristics comprise a circuit impedance of said circuit component.

26. The system of claim 1 wherein said desired operating characteristics comprise an operating temperature.

27. A method for protecting circuit construction elements from degradation, comprising the steps of:
depositing a circuit construction element on a host circuit component portion;
interfacing a circuit component with said deposited circuit construction element, wherein said step of interfacing results in an exposed portion of said circuit construction element remaining after interfacing, and said step of interfacing facilitates a change in operating characteristics of said circuit component due to degradation of said circuit construction element; and
depositing an amount of protective element in a void provided in a corresponding relationship with said exposed portion of said circuit construction element to provide coverage of said exposed portion of said circuit construction element while minimizing contact of said protective element with said circuit component to thereby prevent changes in said operating characteristics of said circuit component due to said degradation of said circuit construction element.

28. The method of claim 27 wherein said circuit construction element is a bonding agent.

29. The method of claim 27 wherein said host circuit component portion is a pedestal surrounded by a channel.

30. The method of claim 27 wherein said step of depositing an amount of protective element comprises the steps of:
depositing said amount of protective element at a single position in said void; and
allowing said protective element to migrate within said void to cover said exposed portion of said circuit construction element.

31. The method of claim 27 wherein said step of depositing an amount of protective element comprises the step of:
depositing at least a portion of said amount of protective element at a plurality of positions in said void.

32. The method of claim 27 wherein said step of depositing an amount of protective element comprises the step of:
extruding said amount of protective element through an extrusion orifice disposed in juxtaposition with said void.

33. The method of claim 32 wherein said step of extruding said amount of protective element comprises the step of:
providing relative movement of said extrusion orifice while extruding said protective element.

34. The method of claim 27 further comprising the step of:
selecting a viscosity of said protective agent to accommodate a desired amount of migration of said protective agent after depositing in said void.

35. A system for maintaining a circuit impedance of a microwave integrated circuit, said system comprising:
a microwave integrated circuit disposed in a host circuit;
a bonding agent disposed between at least a portion of said microwave integrated circuit and at least a portion of said host circuit to retain said microwave integrated circuit and said host circuit in proximity to each other, wherein said bonding agent has at least one exposed portion associated therewith;
a channel disposed to include said exposed portion of said bonding agent therein; and
a predetermined amount of resin disposed in said channel to cover said exposed portion of said bonding agent without covering said microwave integrated circuit.

36. The system of claim 35 wherein a portion of said host circuit said microwave integrated circuit is disposed in is operational at a frequency of at least 20 GHz.

37. The system of claim 35 wherein said host circuit comprises at least a portion of a millimeter wave front end circuit.

38. The system of claim 35 wherein said bonding agent degrades over time due at least in part to exposure of said at least one exposed portion.

39. The system of claim 35 wherein said bonding agent is an epoxy resin.

40. The system of claim 39 wherein said epoxy resin is a metal filled resin.

41. The system of claim 40 wherein said metal filled resin is a silver filled resin.

42. The system of claim 35 wherein said exposed portion of said bonding agent is an edge of said bonding agent disposed between said microwave integrated circuit and said host circuit.

43. The system of claim 42 wherein said channel is formed at least in part in a support substrate of said host circuit.

44. The system of claim 43 wherein said support substrate comprises a ground plane.

45. The system of claim 35, wherein said channel circumscribes said microwave integrated circuit as disposed in said host circuit.

46. The system of claim 45 wherein said microwave integrated circuit as disposed in said host circuit is disposed on a pedestal surrounded by said channel.

47. A method for maintaining the effective operating characteristics of a microwave integrated circuit, said method comprising the steps of:
providing a circuit base having a first portion for supporting a first circuit component and a second portion for supporting said microwave integrated circuit, wherein said first support portion and said second support portion are at least in part separated by a channel;
depositing a bonding agent on said second support portion;
interfacing said microwave integrated circuit with said deposited bonding agent, wherein said step of interfacing results in an exposed portion of said circuit construction element remaining after interfacing; and
depositing a predetermined amount of resin in said channel, wherein a viscosity of said resin is selected to provide migration of said deposited amount of resin to cover said exposed portion of said bonding agent thereby maintaining said effective operating characteristics of said microwave integrated circuit.

48. The method of claim 47 wherein said bonding agent is a silver filled epoxy.

49. The method of claim 47 wherein said resin is a polymeric epoxy resin.

50. The method of claim 27 wherein said circuit component is a microwave integrated circuit.

51. The method of claim 27 wherein said operating characteristic is impedance.

52. The method of claim 47 wherein said operating characteristic is impedance.

53. The system of claim 1 wherein the circuit component is disposed in a host circuit.

* * * * *